US006560102B1

(12) United States Patent
Tong et al.

(10) Patent No.: US 6,560,102 B1
(45) Date of Patent: *May 6, 2003

(54) UNIVERSAL SERIAL BUS DOCKING STATION

(75) Inventors: Eric Tong, Los Angeles, CA (US); Brian Lee Van Harlingen, Los Angeles, CA (US)

(73) Assignee: Belkin Components, Compton, CA (US)

( * ) Notice: Subject to any disclaimer, the term of this patent is extended or adjusted under 35 U.S.C. 154(b) by 117 days.

This patent is subject to a terminal disclaimer.

(21) Appl. No.: 09/695,098

(22) Filed: Oct. 23, 2000

(51) Int. Cl.[7] .................................................. H05K 5/00
(52) U.S. Cl. ..................... 361/686; 361/724; 312/223.1
(58) Field of Search ................................. 361/685–686, 361/715, 724, 735, 744; 312/223.1–223.6; 713/200; 710/104; 345/156

(56) References Cited

U.S. PATENT DOCUMENTS

| | | | |
|---|---|---|---|
| 4,119,359 A | 10/1978 | Schultz ........................ 339/128 |
| 4,845,589 A | 7/1989 | Weidler et al. .............. 361/342 |
| 5,030,128 A | * 7/1991 | Herron et al. ................ 439/372 |
| 5,333,097 A | 7/1994 | Christensen et al. ........ 361/685 |
| 5,336,102 A | * 8/1994 | Cairns et al. ................ 439/272 |
| 5,358,420 A | * 10/1994 | Cairns et al. ................ 439/206 |
| 5,381,315 A | 1/1995 | Hamaguchi et al. ........ 361/727 |
| 5,483,419 A | 1/1996 | Kaczeus, Sr. et al. ...... 361/685 |
| 5,498,174 A | 3/1996 | Speer et al. ................. 439/567 |
| 5,515,239 A | 5/1996 | Kamerman et al. ......... 361/727 |
| 5,586,002 A | 12/1996 | Notarianni ................... 361/681 |
| 5,591,048 A | 1/1997 | Hahn ........................... 439/567 |
| 5,604,662 A | 2/1997 | Anderson et al. ........... 361/685 |
| 5,621,890 A | 4/1997 | Notarianni et al. ..... 395/200.01 |
| 5,673,172 A | 9/1997 | Hastings et al. ............. 361/685 |
| 5,700,159 A | 12/1997 | Albeck ........................ 439/571 |
| 5,706,179 A | 1/1998 | Palatov ........................ 361/788 |
| 5,726,922 A | 3/1998 | Womble et al. ........... 364/708.1 |
| 5,737,189 A | 4/1998 | Kammersgard et al. .... 361/726 |
| 5,777,845 A | 7/1998 | Krum et al. ................. 361/685 |
| RE35,915 E | 10/1998 | Hastings et al. ............. 439/377 |
| 5,835,353 A | 11/1998 | Dalby ........................ 361/727 |
| 5,896,273 A | 4/1999 | Varghese et al. ............ 361/724 |
| 5,938,473 A | 8/1999 | Nishio et al. ................ 439/567 |
| 6,018,456 A | 1/2000 | Young et al. ................ 361/684 |
| 6,141,221 A | * 10/2000 | Tong et al. .................. 361/724 |

* cited by examiner

*Primary Examiner*—Darren Schuberg
*Assistant Examiner*—Hung Van Duong
(74) *Attorney, Agent, or Firm*—Bryan Cave LLP

(57) ABSTRACT

A Universal Serial Bus docking station is provided in which a USB hub includes a housing which may receive at least one additional USB module which is connected to the USB hub without the use of an additional cable. In a preferred embodiment of the invention, up to three USB modules may be inserted into the housing in stacked arrangement. In addition, each USB module maybe used as a stand alone unit by snapping a sleeve onto the rear of the module. Still further, a USB connector is adapted for use standing vertically from a circuit board and being retained by spring clips extending through the circuit board in a direction substantially parallel to the longitudinal axis of the connector.

25 Claims, 15 Drawing Sheets

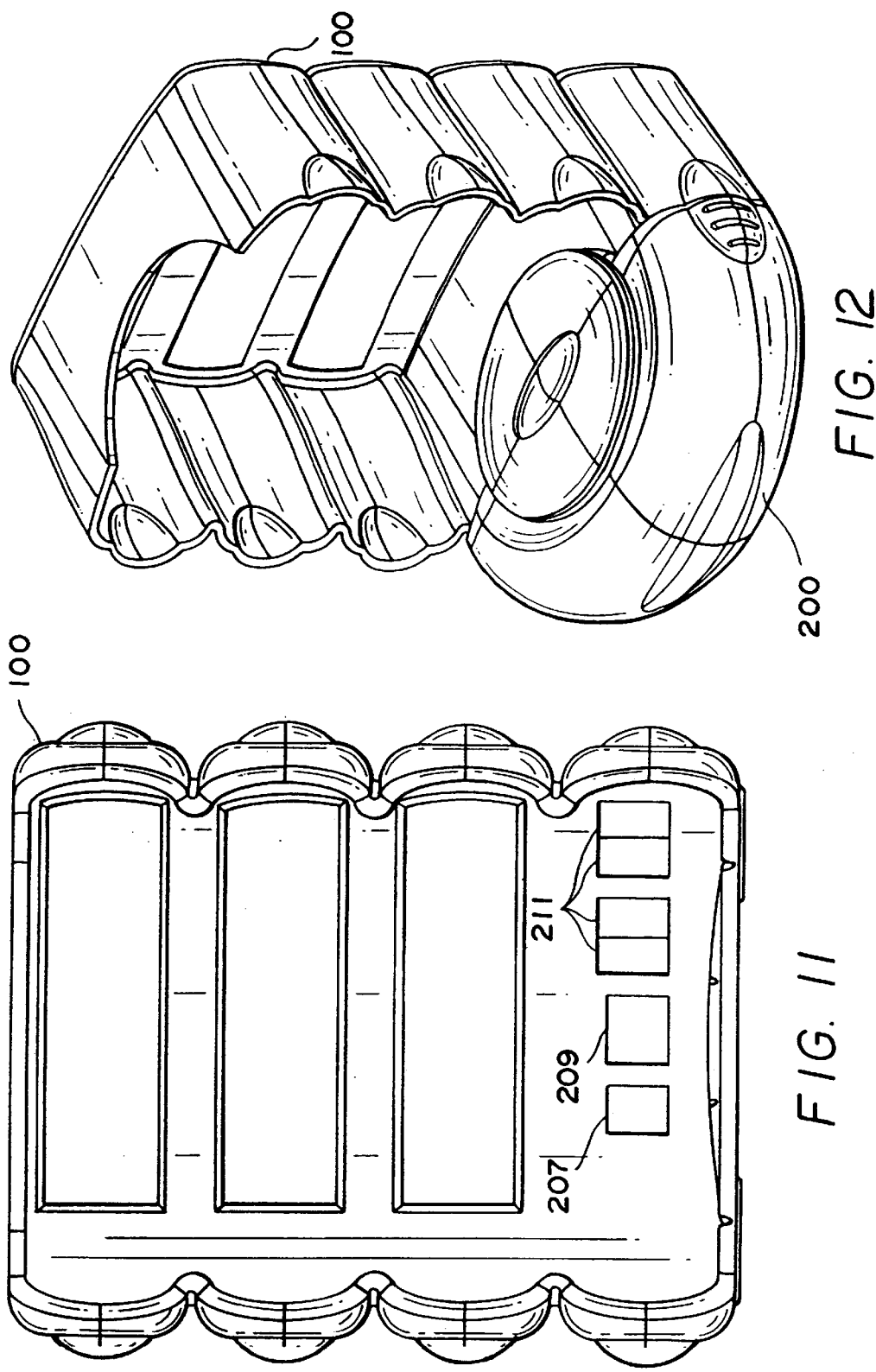

UNIVERSAL SERIAL BUS DOCKING STATION

FIELD OF THE INVENTION

The present invention relates to so-called Universal Serial Bus interconnects, in general, and to Universal Serial Bus hubs in which cabling is simplified, in particular.

BACKGROUND OF THE INVENTION

The Universal Serial Bus ("USB") development as a standard for use with personal computers has been motivated by the necessity to provide for connection of the personal computer ("PC") to the telephone, the necessity for ease-of-use or the so called "plug and play" approach, and the need to facilitate the addition of external peripherals. For years, computer users have been limited in their ability to add devices to their computers.

The Universal Serial Bus of "USB" is a standard peripheral interface for attaching PCs to a wide variety of peripheral devices including keyboards, mice, scanners, printers, game controllers, modems and other peripherals. With USB, up to 128 devices may be interconnected.

All types of devices are now available as USB devices. No longer does a user have to worry about configuring his/her system. When a USB device is plugged in, the device is automatically detected, and the software is automatically configured. The USB is useable with video capture devices, keyboards, mice and scanners. USB devices require a central processing unit as a host unit.

The standards for USB are publicly available and are the result of a collaborative effort by major computer manufacturers. The Universal Serial Bus Specification revision 1.1 (Sep. 23, 1998) by Compaq, Intel, Microsoft and NEC sets forth connectivity standards for PC architecture. It sets forth a "fast, bi-directional, isochronous, low-cost, dynamically attachable serial interface structure that is consistent with the requirements of the PC platform of today and tomorrow." The specification defines an industry-standard USB and describes the bus attributes, the protocol definition, types of transactions, bus management, and the programming interface required to design and build systems and peripherals that are compliant with the standard. All USB devices connect to the USB through ports on specialized USB devices referred to as "hubs". Hubs are wiring concentrators. Attachment points to hubs are referred to as ports. Each hub converts a single attachment point into multiple ports. The architecture supports concatenation of multiple hubs.

The USB topology is such that the USB connects USB devices with a USB host in a tiered star topology. A hub is at the center of each star. Each wire segment of the USB is a point-to-point connection between the host and a hub or function, or a hub connected to another hub or function. The upstream port of a hub connects towards the host. Each downstream port of a hub allows connection to another hub or function.

In the USB topology there is only one host. A root hub is integrated within the host system to provide one or more attachment points. Additional attachment points to the USB are provided by hubs. Each hub may be connected to additional hubs and to functions which provide capabilities to the system, such as an ISDN connection, a digital joystick or speakers. All USB devices attach to the USB through ports on hubs.

The USB transfers signal and power over a four wire cable. All USB devices have an upstream connection, and USB cables have an upstream and a downstream connector. The upstream and downstream connectors are not mechanically interchangeable to eliminate illegal loopback connections at the hubs.

In accordance with USB standards, all attached devices connect to the host device through a single connector type using a tiered star topology. Personal computers typically have one or two USB ports. To provide for connecting to a number of devices, a cable connection is provided to a USB hub via a USB cable. Currently, hubs having four or seven ports are dominant, which give four or seven additional USB connectors. In addition, a USB cable may connect from the USB hub to one or more additional USB hubs. One of the limitations that applies to USB architecture is a distance limitation which is a 5 meter cable length, or its electrical equivalent, between devices.

A PC configuration using USB hubs and functions will require a number of different items to be cabled together. The cables interconnecting the hubs and functions creates an undesirable cabling appearance.

SUMMARY OF THE INVENTION

In accordance with the principles of the invention, a docking station for a universal serial bus includes a hub having an upstream connector and a plurality of downstream connectors. The hub is disposed generally in a horizontal plane. A docking housing is coupled to the hub. The docking housing receives at least one USB module. The docking housing carries a first connector that is electrically coupled to the hub. The module carries a mating first connector configured to electrically connect to the first connector when the module is inserted into the docking housing. When the module is so inserted, the module is automatically connected to the hub without use of a separate cable. Further in accordance with the invention, additional modules may be inserted into the docking station. In the illustrative embodiment, the docking station can accommodate up to three modules. The three modules may be any combination of USB hubs and USB functions.

Further in accordance with the invention, a USB module may be used as a stand alone unit with a removable sleeve that snapingly engages the module. The USB module includes a housing containing USB interfacing circuitry. A connector is disposed on the rear of the housing, and one or more first retaining elements are carried on the housing. The sleeve adapted to cover a portion of said housing has one or more second retaining elements adapted to engage corresponding ones of the first retaining elements, whereby the sleeve is removably retained on the USB module housing.

Further in accordance with the invention, a USB connector is provided which has an elongated sleeve and a plurality of electrical contacts carried therein. A plurality of electrical connector pins extend from said sleeve in and parallel with a longitudinal axis of the sleeve. A pair of retainer arms or clips extend from the sleeve in a direction generally parallel to the longitudinal axis. Each retainer arm is of the same metal material as the sleeve and has a portion bent angularly such that when said connector is mounted onto a circuit board, the retainer arms exert retaining forces against said circuit board to retain the connector, thereby facilitating assembly. A shoulder disposed on the sleeve proximate the retainer arms provides surfaces that may be captured between a circuit board and a retainer plate disposed parallel to said circuit board.

BRIEF DESCRIPTION OF THE DRAWING

The invention will be better understood from a reading of the following detailed description in conjunction with the drawing figures, in which like reference designators are used to identify like elements, and in which:

FIG. 11 is a rear view of the Station of FIG. 9;

FIG. 12 is a front perspective view of the station of FIG. 9;

DETAILED DESCRIPTION

Figure 1:
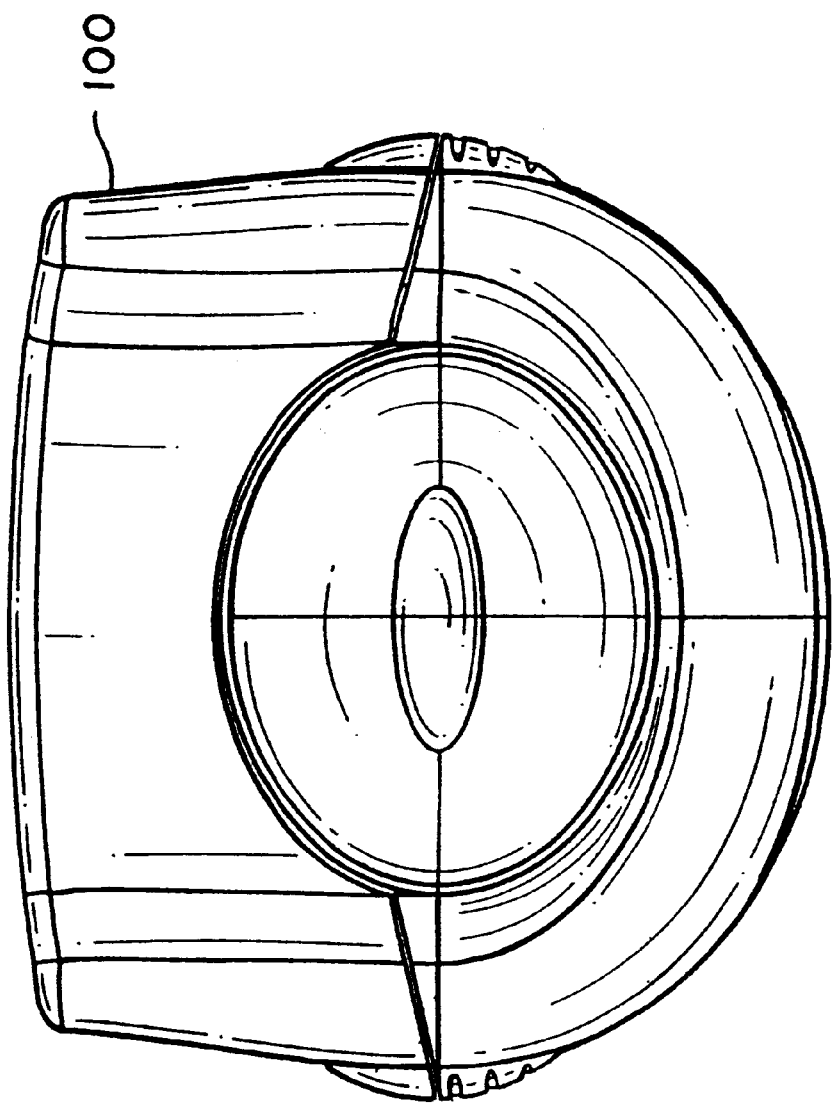
FIG. 1 is a top planar view of a Universal Serial Bus Docking Station with electronic modules.
Figure 2:
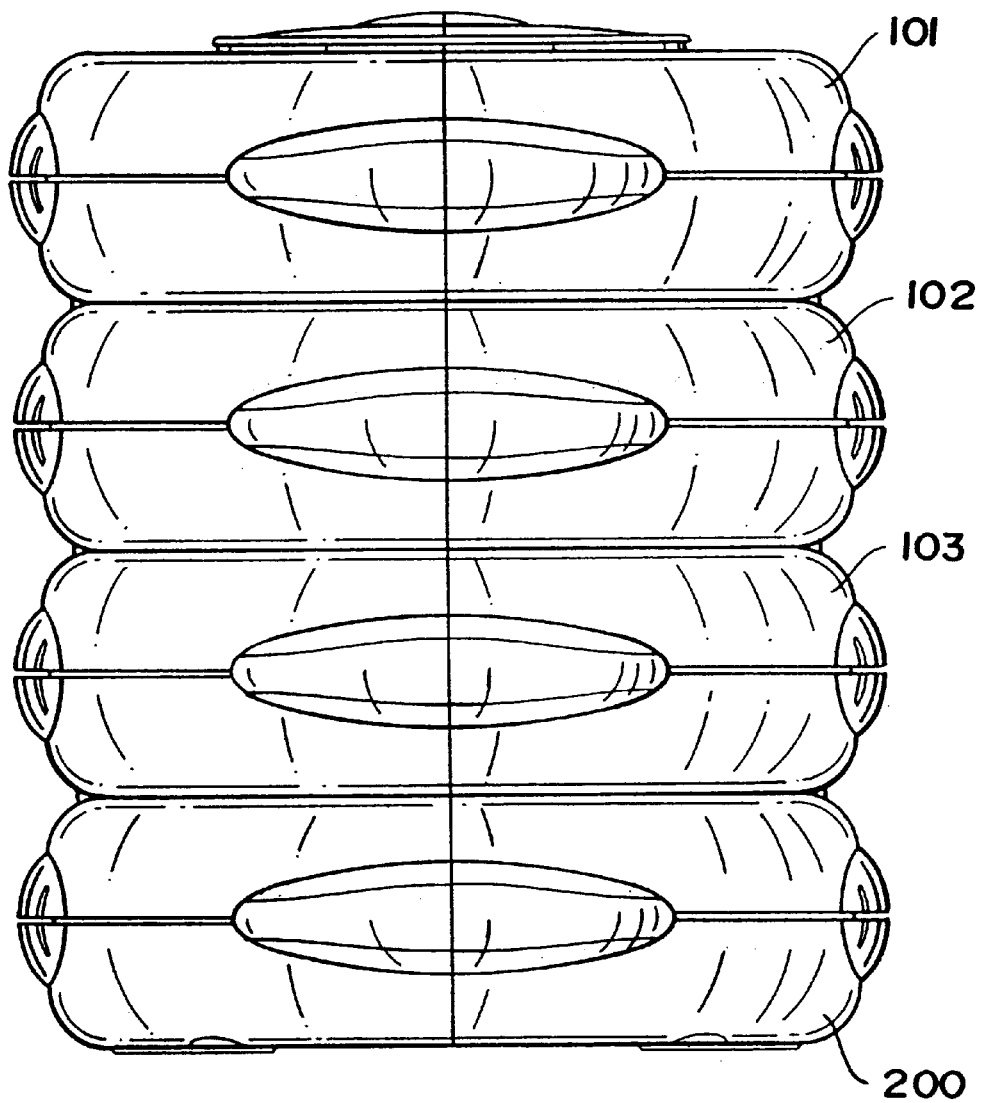
FIG. 2 is a front planar view of the Station of FIG. 1.
Figure 3:
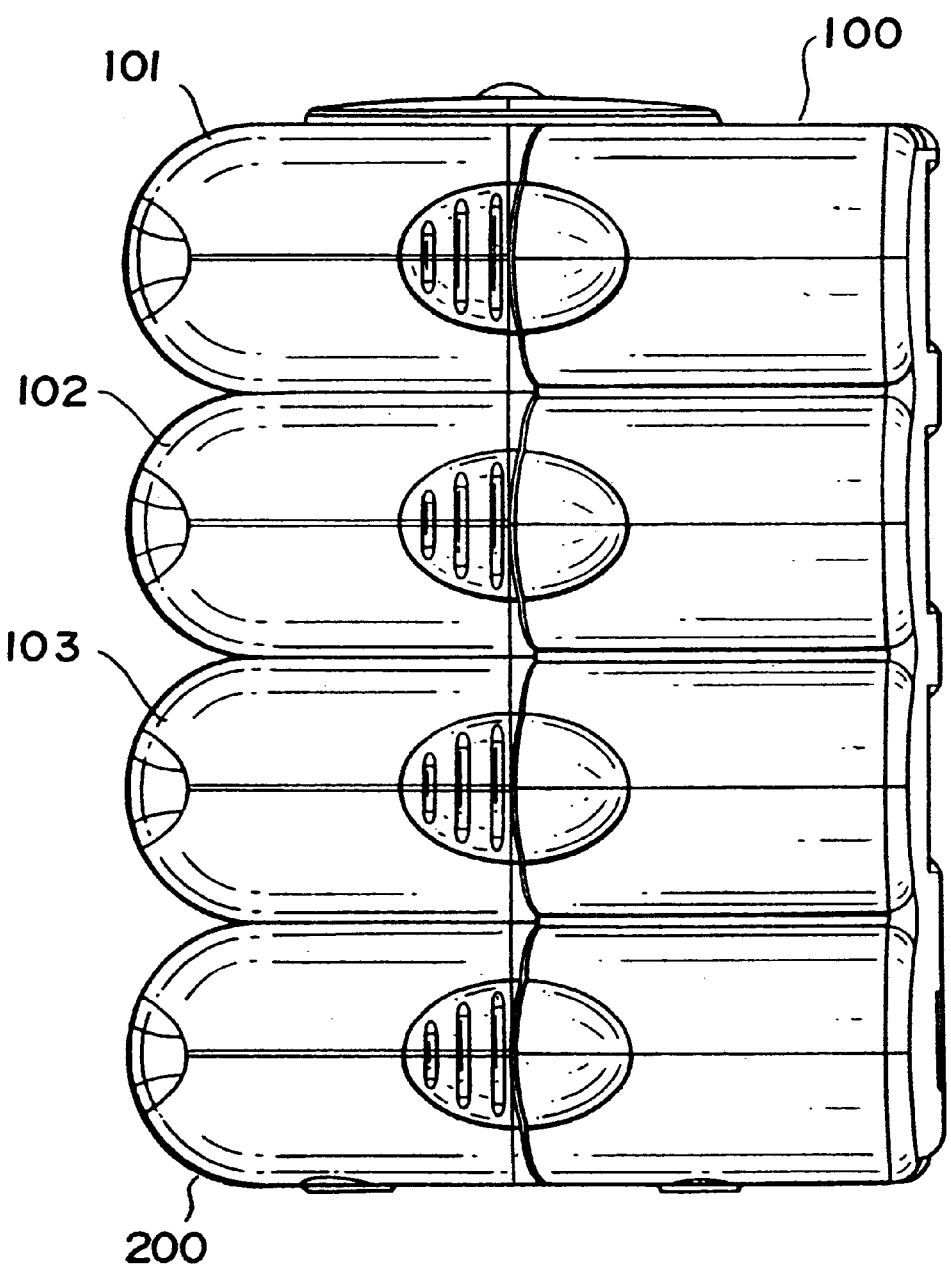
FIG. 3 is a left side planar view of the Station of FIG. 1, the right side view being a mirror image of the left side view.
Figure 4:
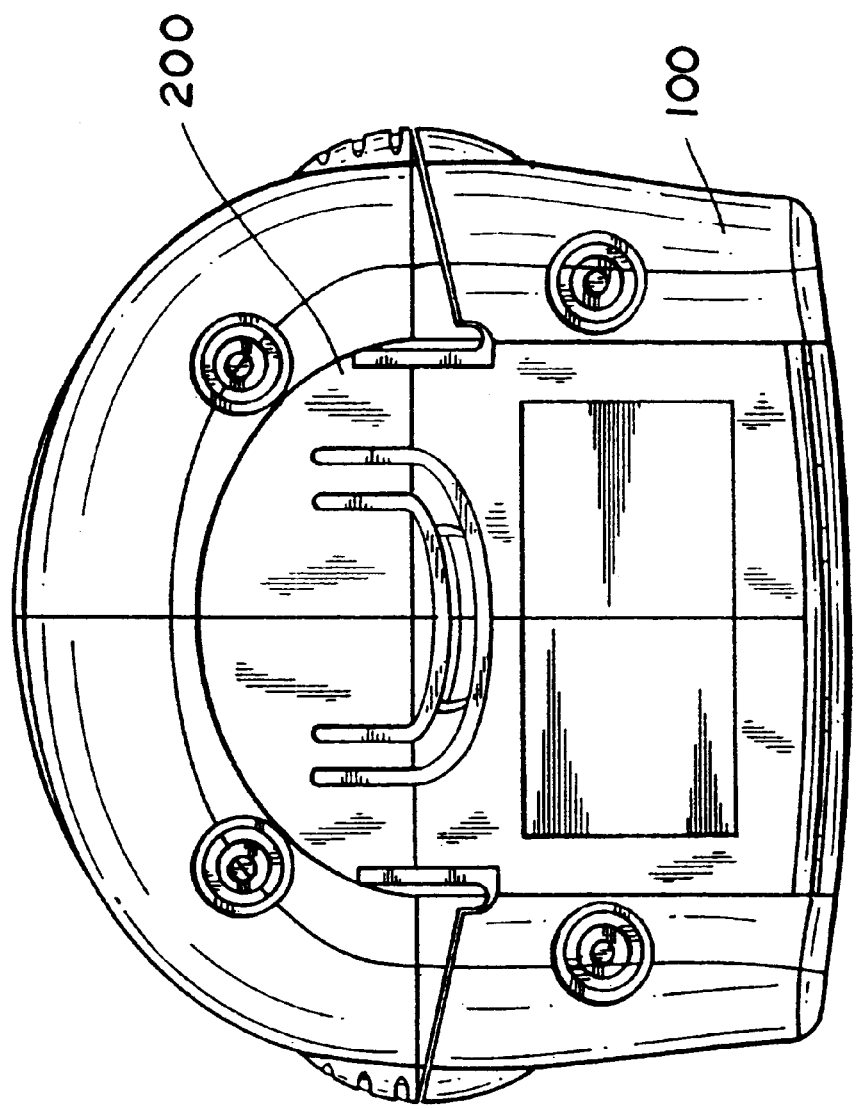
FIG. 4 is a bottom planar view of the Station of FIG. 1.
Figure 5:
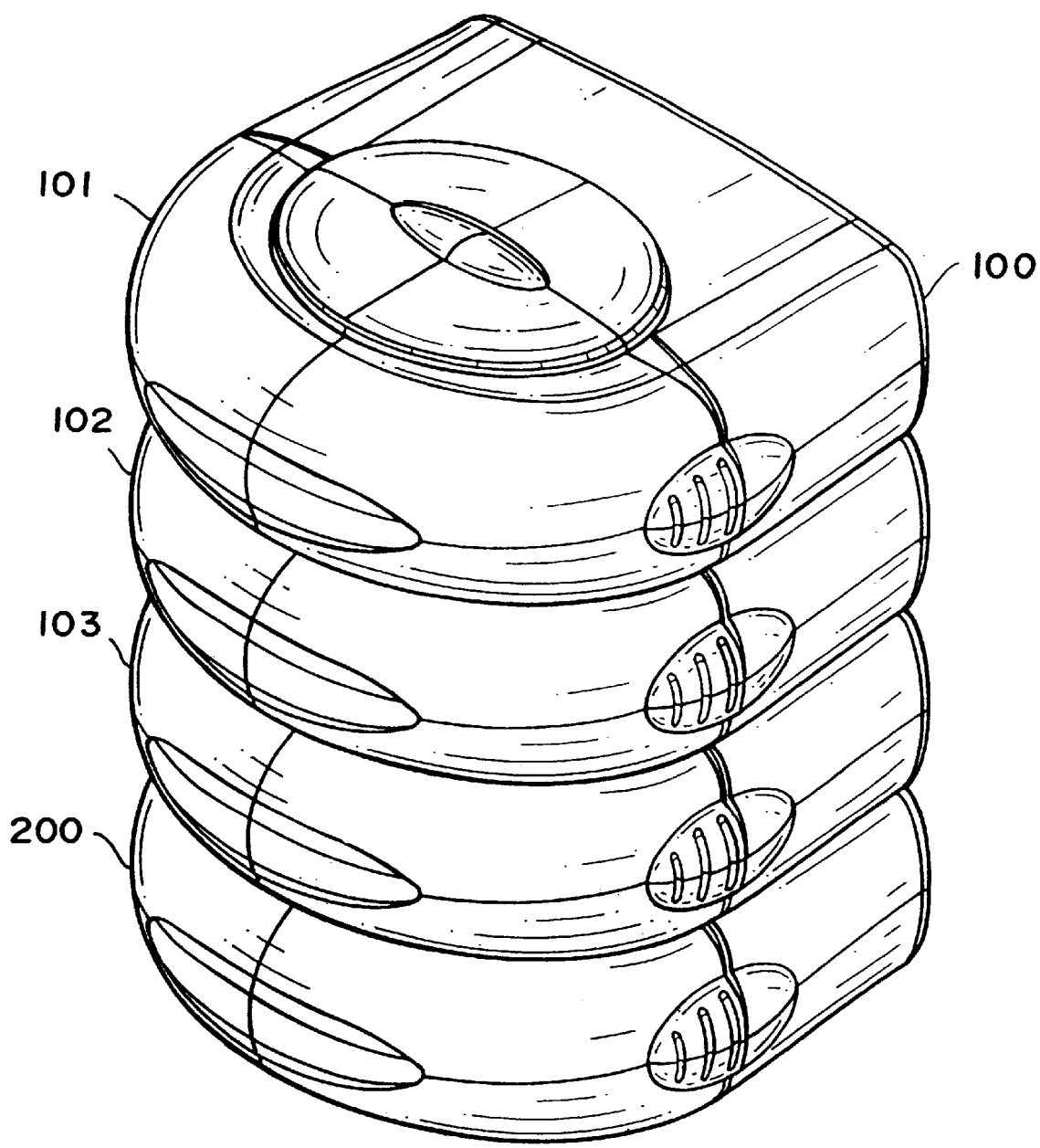
FIG. 5 is a perspective view of the Station of FIG. 1 with electronic modules.
Figure 6:
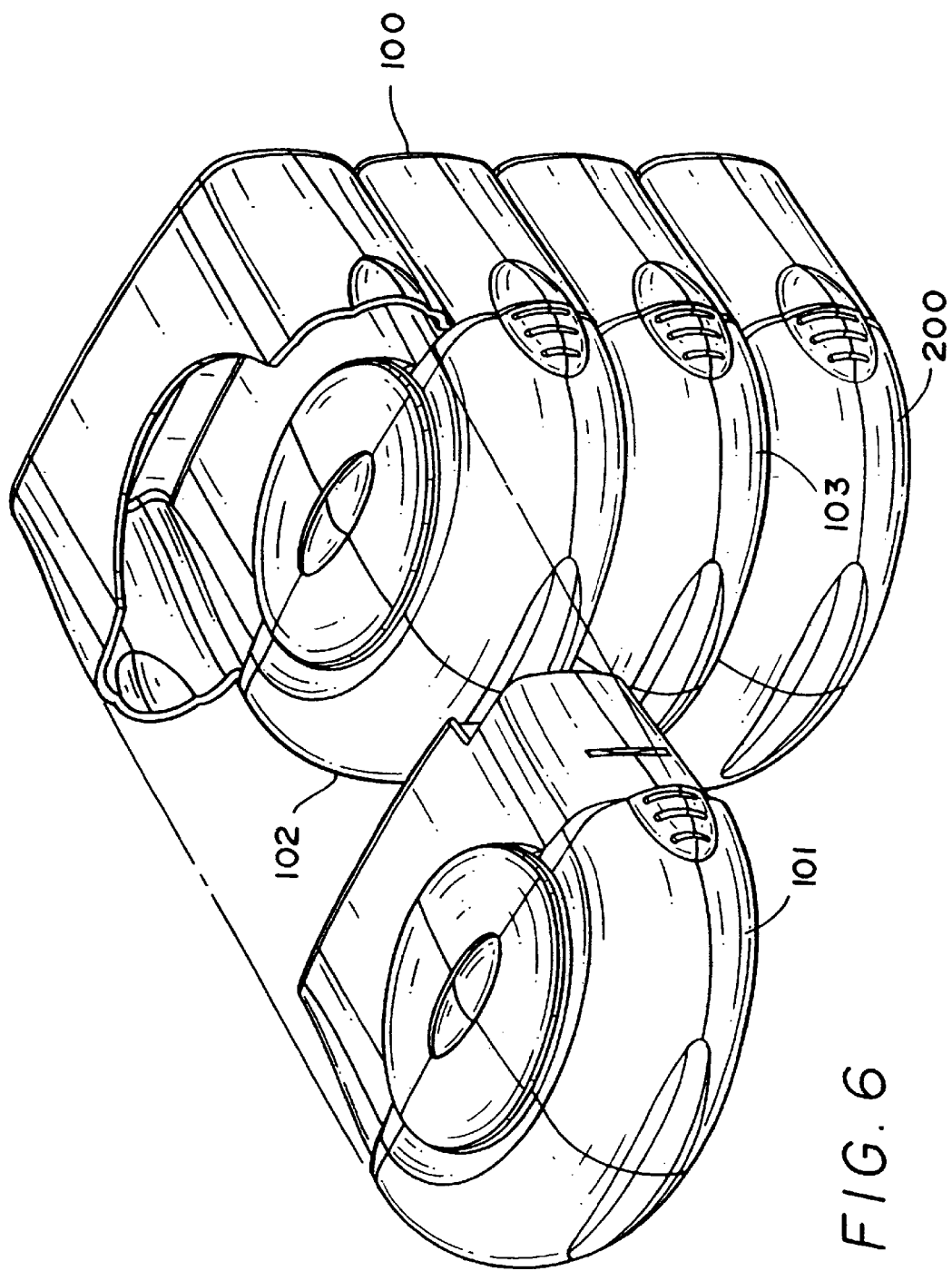
FIG. 6 is an exploded perspective view of the Station of FIG. 1 with one module separated from the docking station common portion.

The entirety of the Universal Serial Bus Specification Revision 1.1 is incorporated herein by reference. A Universal Serial Bus Docking Station is shown in FIGS. 1–13. The docking station 100 includes a hub 200 and is populated with modules 101, 102, 103. Each of modules 101, 102, 103 can be either a USB hub or a USB function. A USB hub as used herein is a USB device that provides additional connections to a USB. A USB function is a USB device that provides capability to a host, such as for example, an ISDN connection, a digital microphone, or speakers. Where a module is a USB function, it in some instances provides the necessary interface between the actual item providing the functionality and the USB. Although three modules 101, 102, 103 are shown inserted into docking station 100, as is clearly evident from FIGS. 6–8, docking station 100 may be populated with 0, 1, 2 or 3 modules 101, 102, 103.

Figure 7:
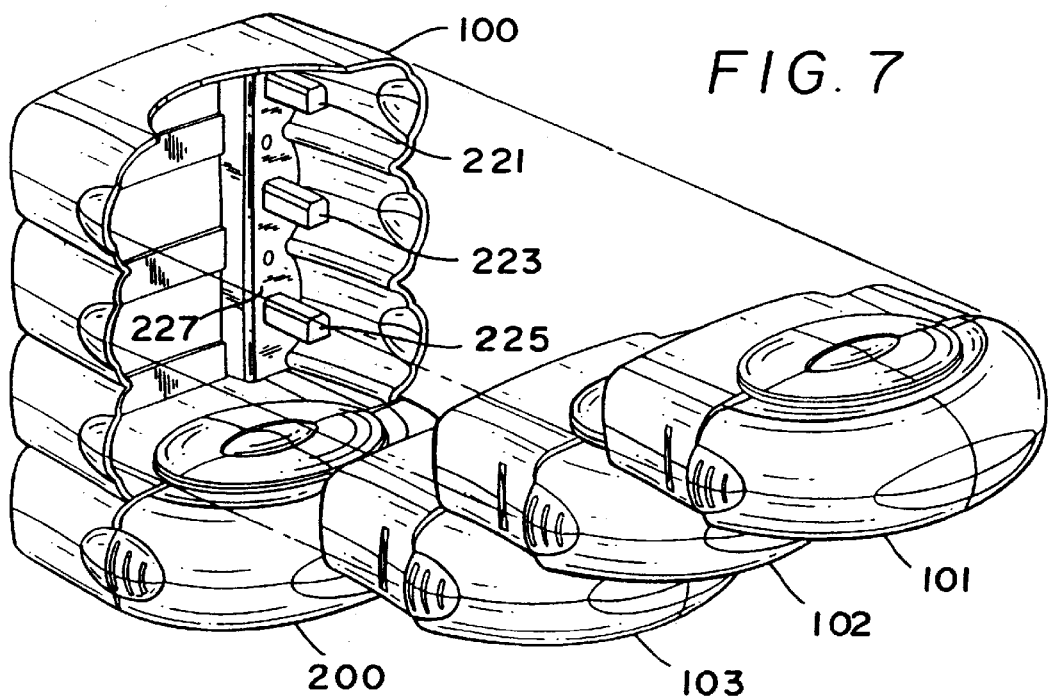
FIG. 7 is a right side exploded perspective view of the Station of FIG. 1 with three modules separated from the common docking station portion.
Figure 8:
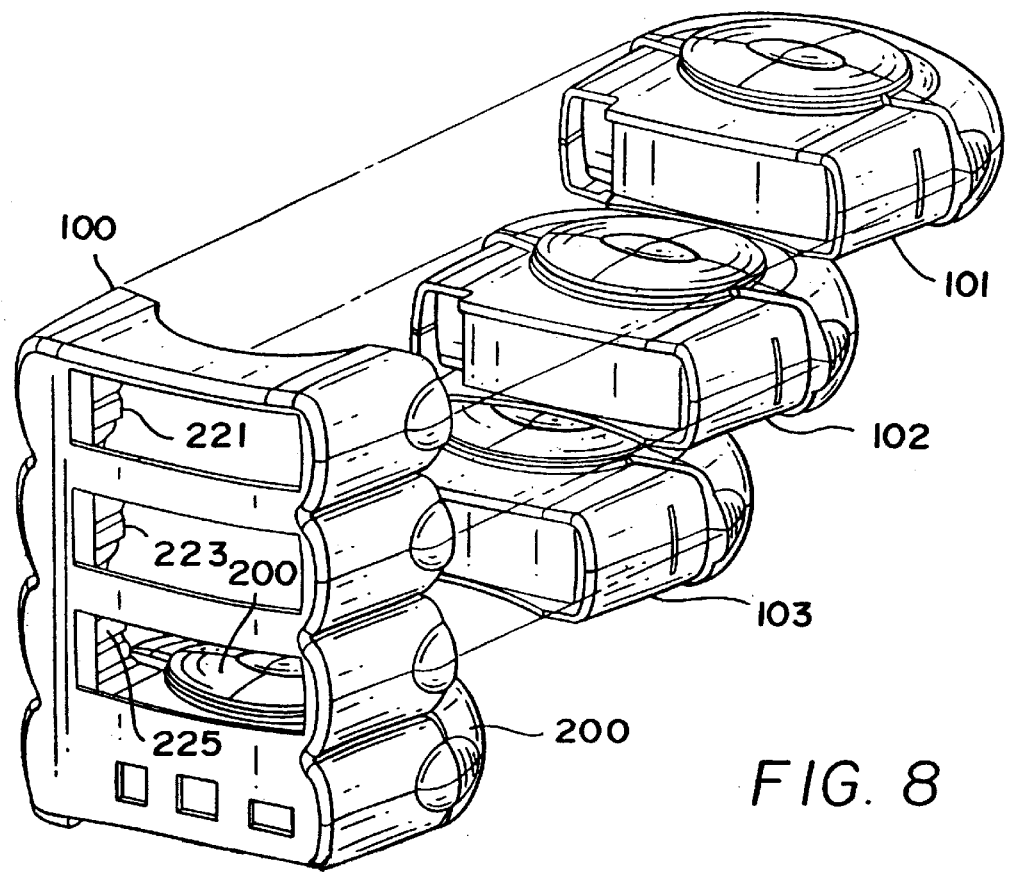
FIG. 8 is a rear exploded perspective view of the Station of FIG. 1 with three modules separated from the common docking station portion.
Figure 10:
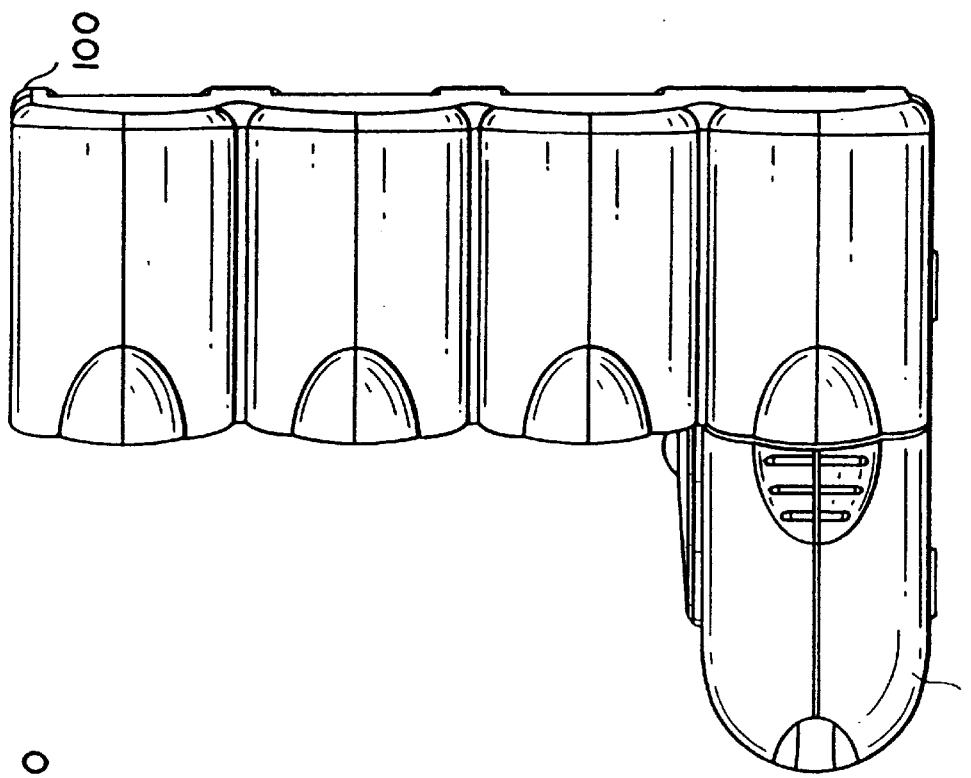
FIG. 10 is a left side view of the Station of FIG. 9.
Figure 9:
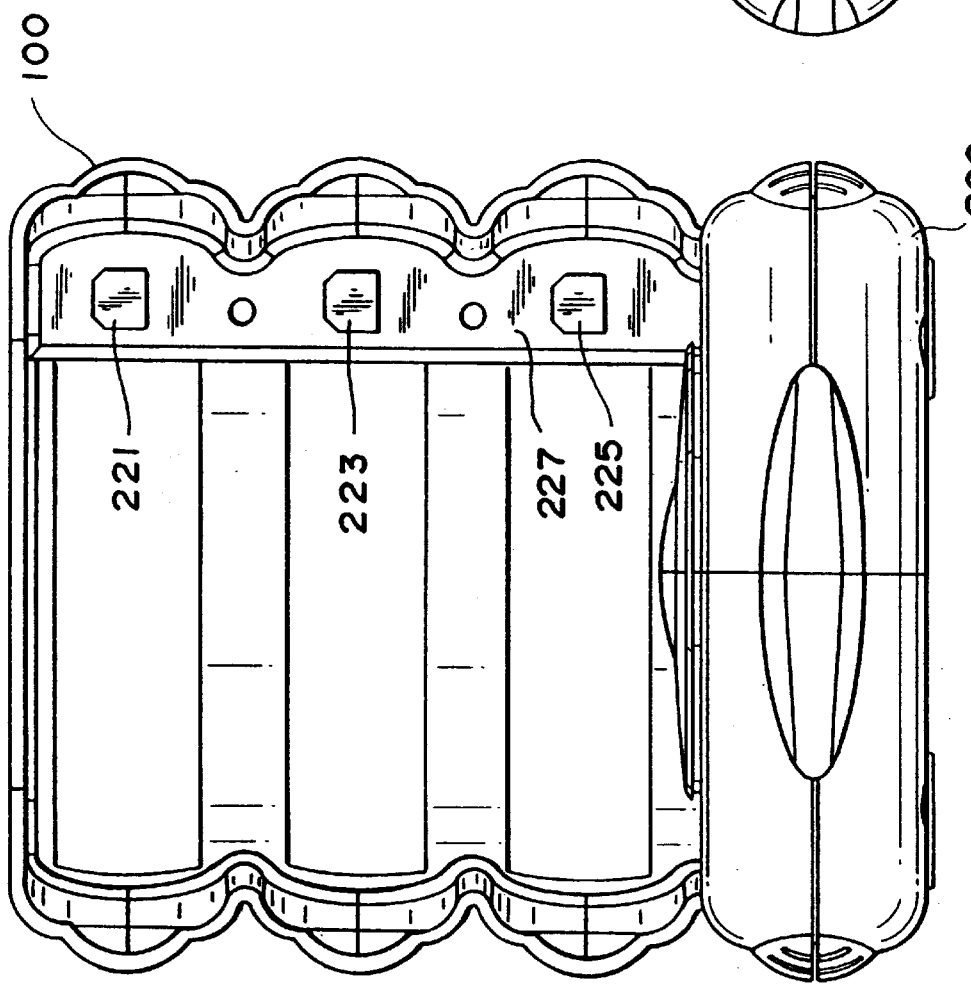
FIG. 9 is a front view of the Station of FIG. 1 with all modules removed.
Figure 13:
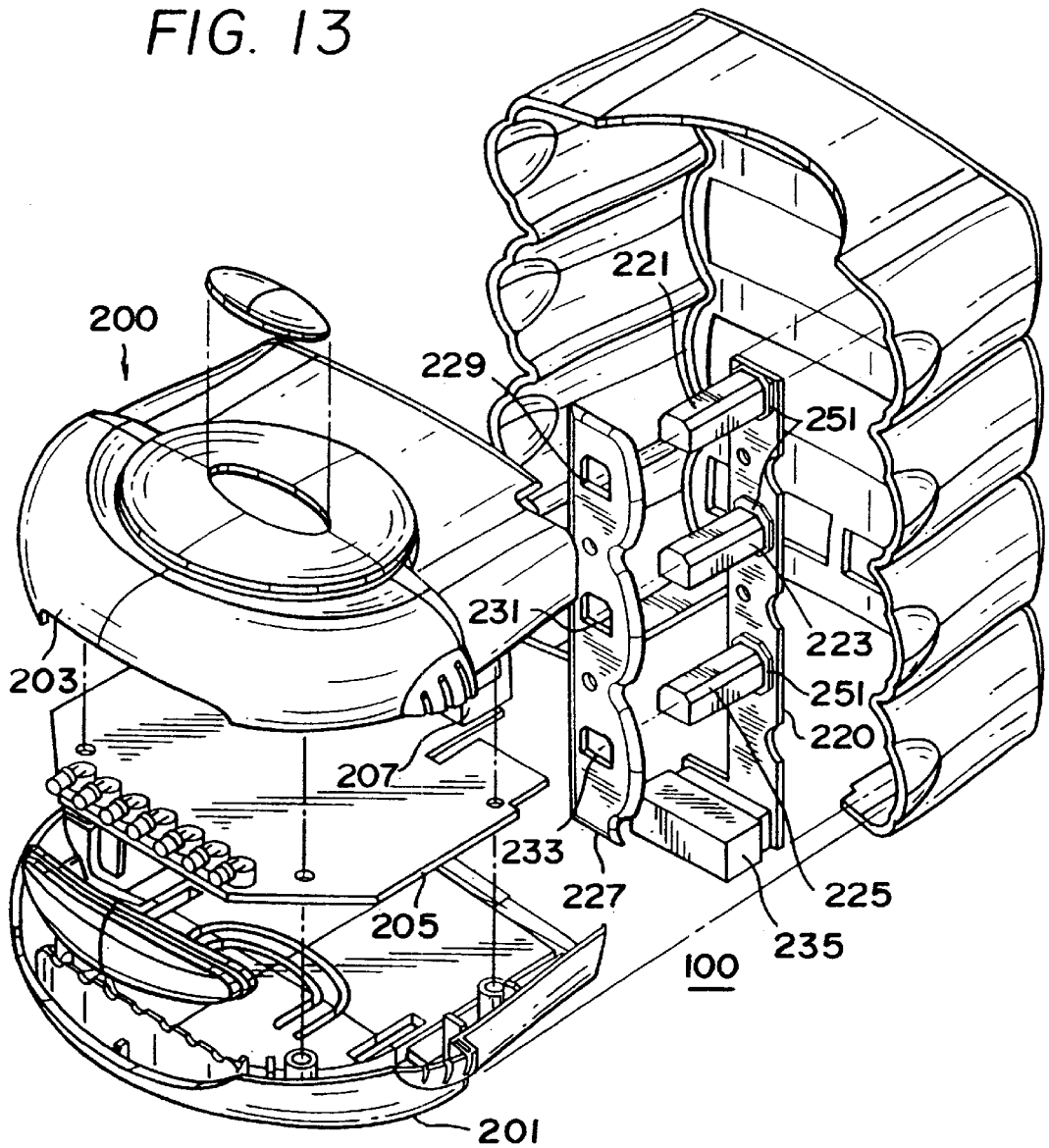
FIG. 13 shows the station of FIG. 9 in exploded perspective view.
Figure 15:
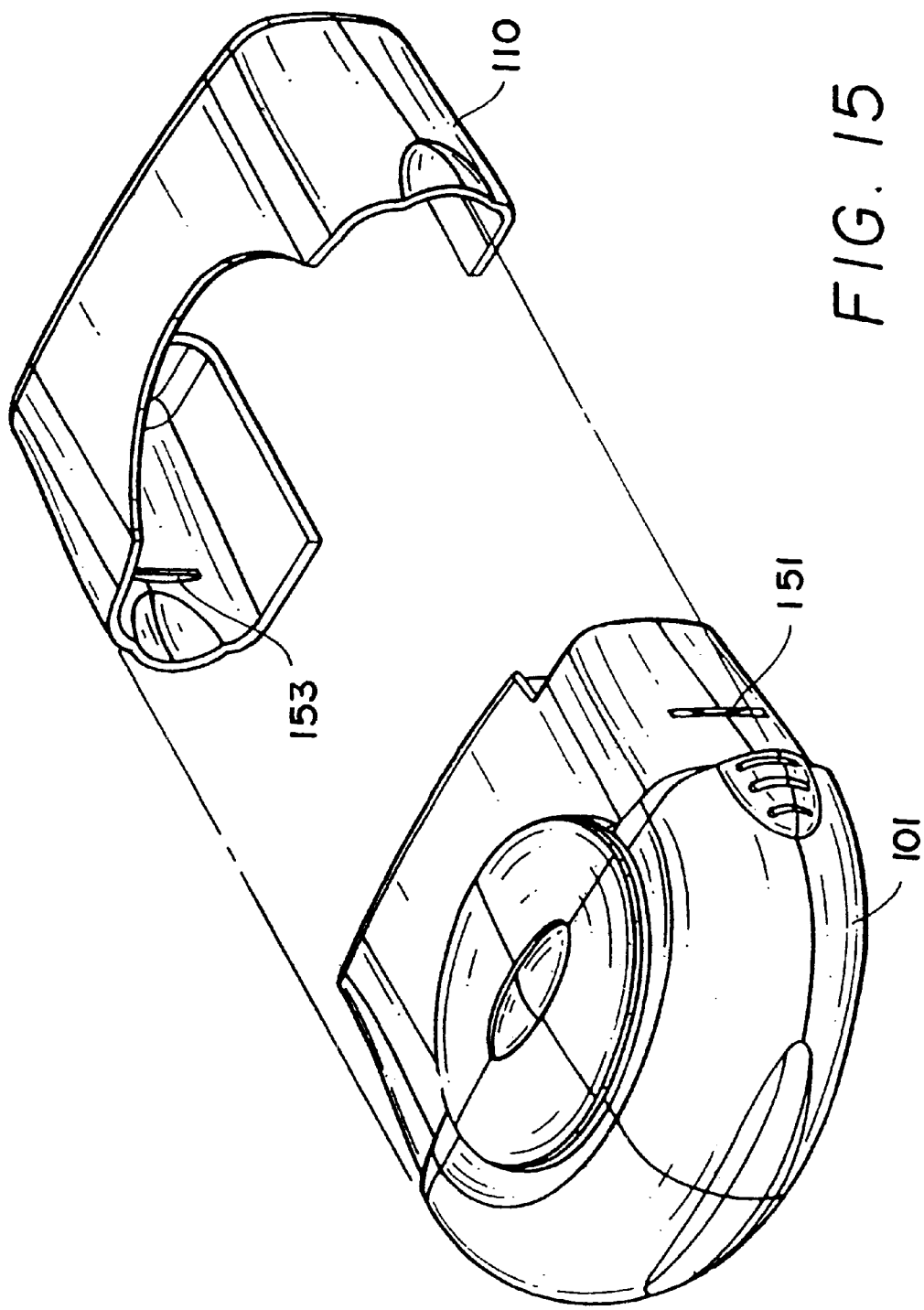
FIG. 15 is an explode perspective view of a module and a cover.
Figure 16:
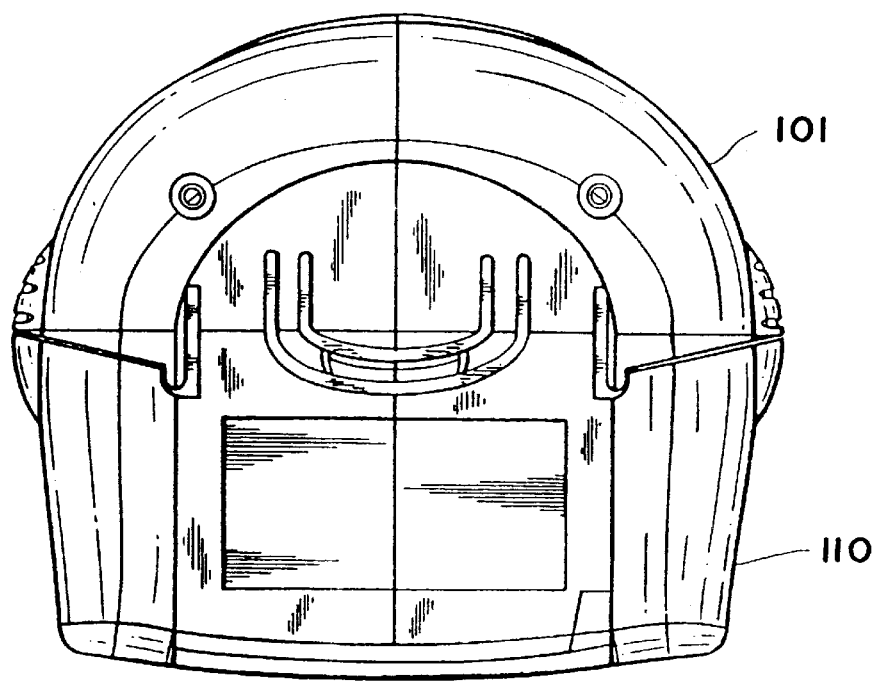
FIG. 16 is a bottom planar view of the module and cover of FIG. 15.
Figure 17:
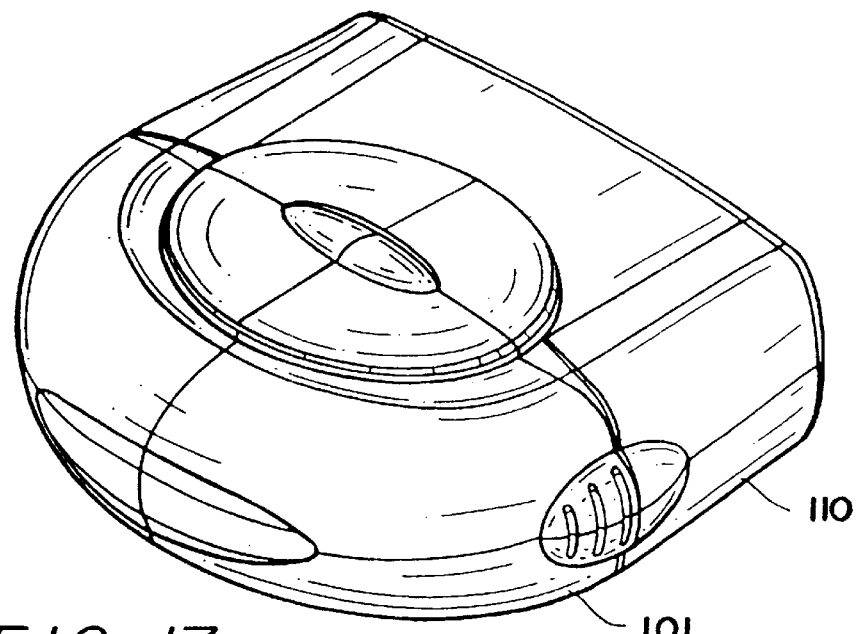
FIG. 17 is a front perspective view of the module and cover of FIG. 15.
Figure 18:
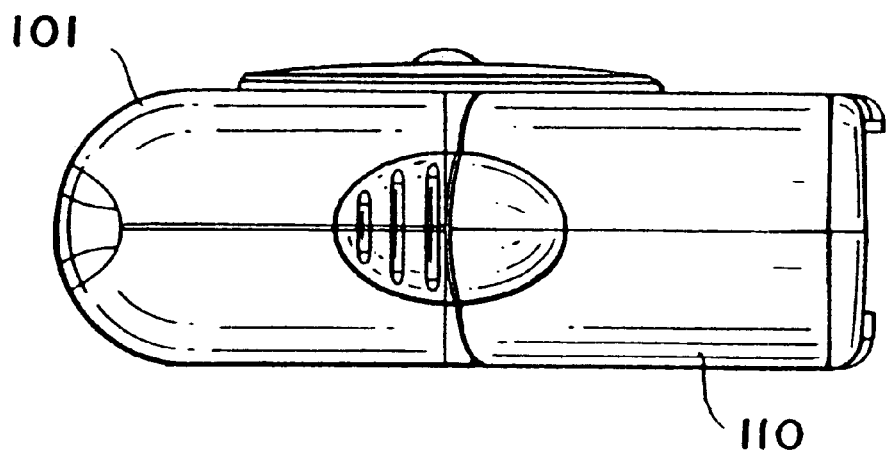
FIG. 18 is a left side view of the module and cover of FIG. 15.
Figure 19:
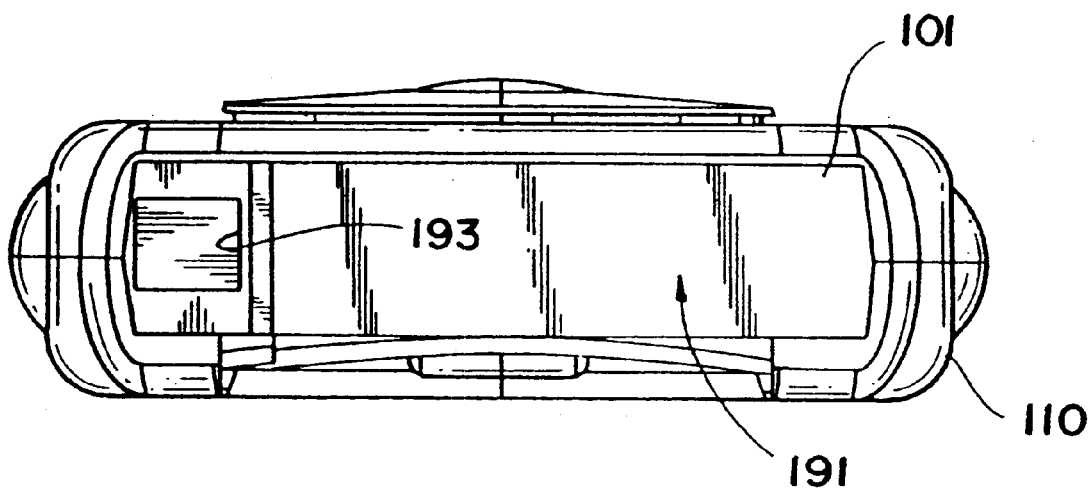
FIG. 19 is a rear view of the module and cover of FIG. 15.

FIGS. 15–19 illustrate a representative module 101. It will be understood by those skilled in the art that module 101 may be a USB hub or a USB function. More specifically, module 101 may be used in conjunction with docking station 100, or it may be a stand alone unit. When used as a stand alone unit, a snap on sleeve 110 is used in conjunction with the module 101. Module 101 includes detents 151 on its right and left sides, only one detent being shown in FIG. 15. Detents 151 will engage corresponding ribs 153 carried on housing 110. Only one rib 153 is shown in FIG. 15. It will be appreciated by those skilled in the art that the positions of the ribs and detents may be reversed or other arrangements for providing a locking snap arrangement can be provided. It should be noted that in the rear view of module 101 shown in FIG. 19, no particular connectors are shown. The connectors that would be carried by a module 101 are determined by whether module 101 is a USB hub or a USB function. Such connectors may be carried in area 191 on the rear of module 101. Each module 101, 102, 103 additionally carries a connector 193. When module 101 is mated with sleeve 110, the rear of sleeve 110 is open to permit any connectors on the rear of module 101 to be accessible. As illustrated in FIGS. 7 and 8, when module 101 is inserted into a docking station 100, connector 193 receives mating connector 221 carried by docking station 100.

Figure 14:
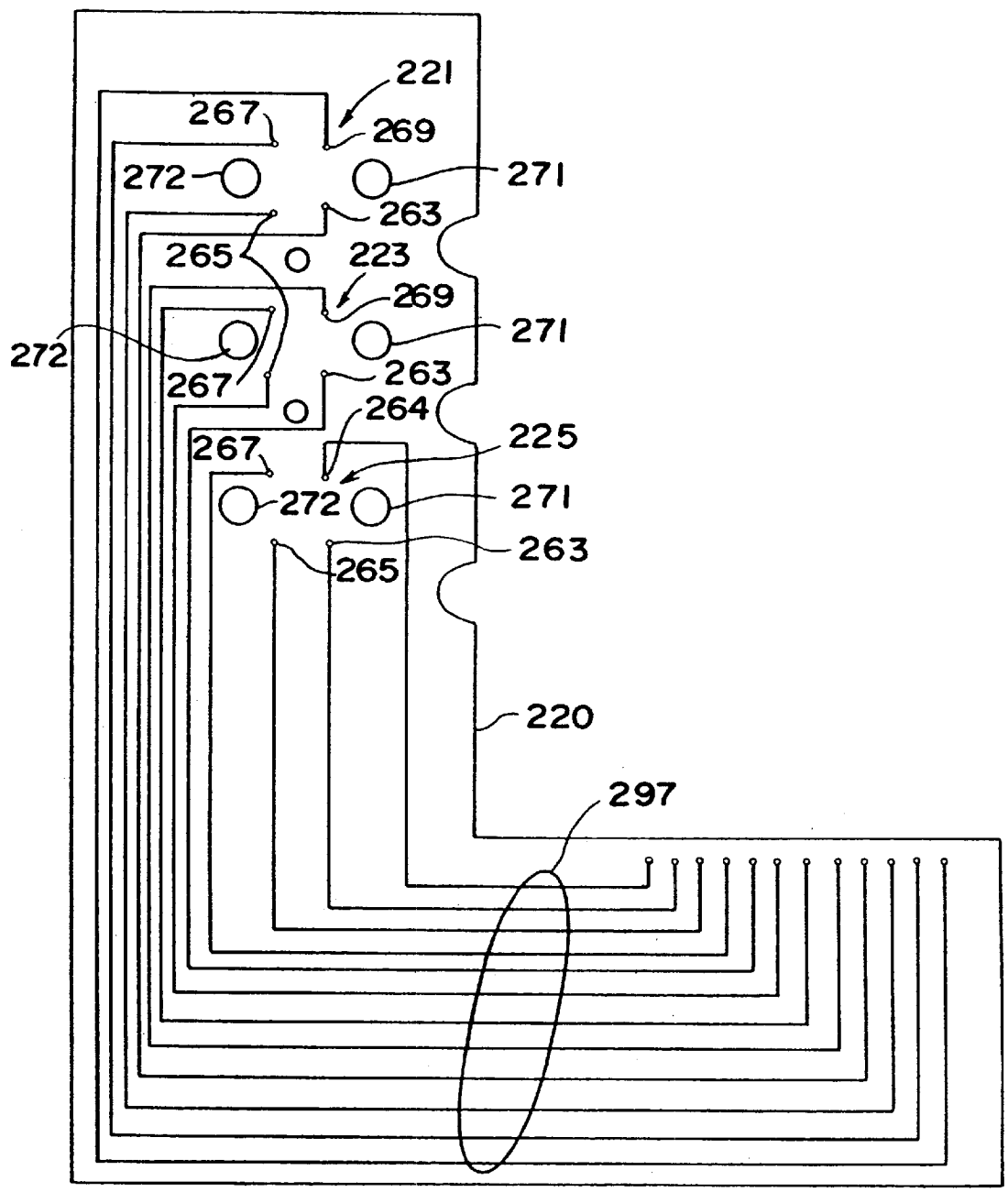
FIG. 14 shows a circuit board of FIG. 13 in rear planar view.
Figure 21:
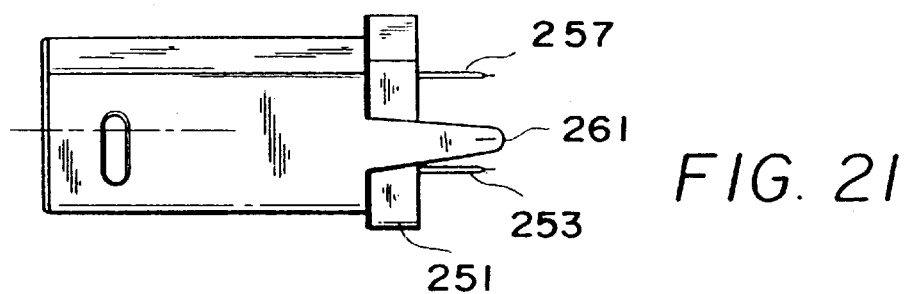
FIG. 21 is a top view of the connector of FIG. 20.
Figure 20:
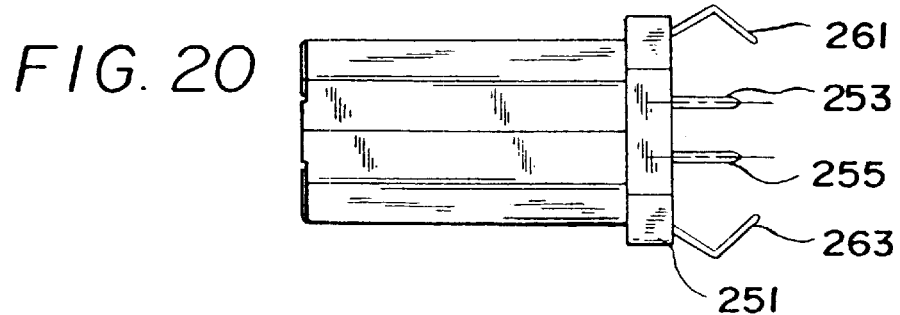
FIG. 20 is a side view of a connector mountable onto the circuit board of FIG. 14.
Figure 22:
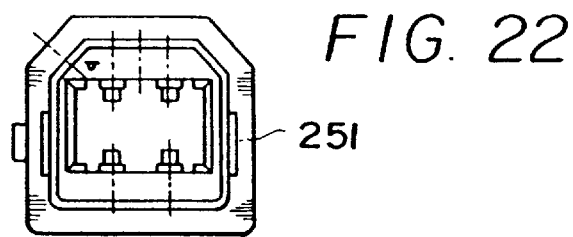
FIG. 22 is a front end view of the connector of FIG. 20.
Figure 23:
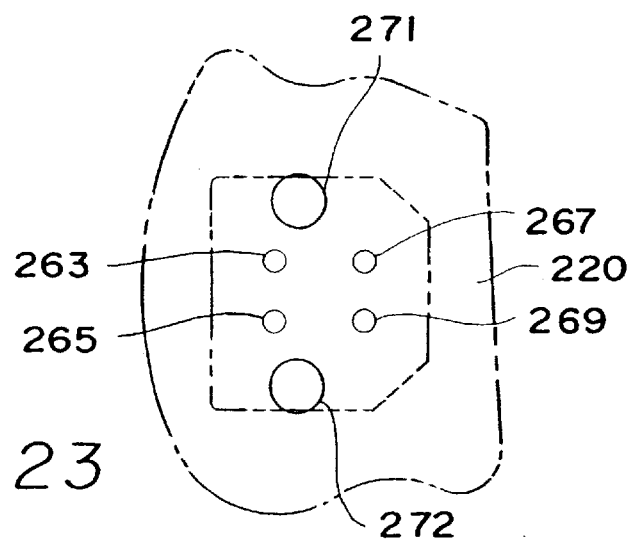
FIG. 23 is a view of a portion of the circuit board of FIG. 14 adapted to receive the connector of FIG. 20.

Turning back to FIG. 13, docking station 100 includes hub 200 which comprises bottom casing 201, upper casing 203 and its internal electronics carried on printed circuit board 205. The electronic circuitry may be any hub circuitry presently commercially utilized in USB hubs. Mounted on printed circuit board 205 are a power connector 207, a USB type B connector 209 (FIG. 11) and four USB type A connectors 211 (FIG. 11). USB type B connector 209 is an upstream connector, and USB type A connectors 211 are downstream connectors. In the configuration shown for docking station 100, docking station 100 functions as a 7-port hub. A printed circuit board 220 extends vertically upward from hub 200. Printed circuit board 220 carried three connectors 221, 223 and 225, which are disposed to engage corresponding connectors 193 (FIG. 19) on modules 101, 102, 103, respectively, when they are inserted into docking station 100. Printed circuit board 220 includes conductor paths 297 (FIG. 14) from electrodes on connectors 221, 223, 225 to a connector block 235 which in turn mates with printed circuit board 205. Connector 235 provide a directional translation for the conductor paths from printed circuit board 205 to vertical printed circuit board 220. Disposed upon circuit board 220 is a support 227 which has apertures 229, 231, 233, each adapted to receive and support connectors 221, 223, 225, respectively. Each connector as shown in FIGS. 20–22 includes shoulder portion 251 which is captured between printed circuit board 220 and support retainer 227. Still further, each connector 221, 223, 225 includes a pair of retaining clips 261, 263. Retaining clips 261, 263 are formed as extensions of the steel shell of the connector. Each extension 261, 263 is bent outward away from the center of a connector and then inward. When the connector is mounted onto the printed circuit board, clips 261 and 263 retain the connector in position until the terminals 253, 255, 257, 259 are soldered. As shown in the portion of printed circuit board 220 shown in FIG. 23, apertures 271 and 272 are sized to engage the clips 261 and 263 respectively, whereas apertures 263, 265, 267, 269 are adapted to receive terminals 253, 255, 257, 259, respectively. This connector arrangement permits easy and fast assembly prior to soldering of the connectors to the printed circuit board. The conductor pattern on printed circuit board 220 is a representative pattern; it should be evident to those skilled in the art that the conductor paths from each connector 221, 223, 225 extends to connector 235 where electrical connection is made to corresponding conductors on circuit board 205.

As indicated above, each module 101, 102, 103 includes a connector which is positioned such that it will engage one of the connectors 221, 223, 225 when the corresponding module 101, 102, 103 is inserted into the docking station 100.

The docking station body is formed of plastic material as are the housings for modules 101, 102, 103 and the housing for hub 200.

As will be readily apparent to those skilled in the art, the foregoing embodiments of the invention may be modified or changed without departing from the spirit or scope of the invention. The embodiments shown are intended to explain the invention, but are not intended to limit the scope of the invention. It is intended that the scope of the invention be limited only by the claims appended hereto.

What is claimed is:

1. A USB connector comprising:

a sleeve:

a plurality of electrical contacts located in said sleeve;

a plurality of electrical connector pins extending from said sleeve;

a pair of retainer arms extending from said sleeve, when said connector is mounted onto a circuit board, said retainer arms exert retaining forces against said circuit board to retain said connector; and a shoulder disposed adjacent to said sleeve proximate said retainer arms, said shoulder providing a surface that may be located between the sleeve and a retainer plate disposed parallel to said circuit board.

2. The USB connector of claim 1 wherein:
   the sleeve is elongated.

3. The USB connector of claim 1 wherein:
   the plurality of electrical connector pins extend from the sleeve in parallel with a longitudinal axis of the sleeve.

4. The USB connector of claim 1 wherein:
   the pair of retainer arms extend from the sleeve in a direction generally parallel to a longitudinal axis of the sleeve.

5. The USB connector of claim 1 wherein:
   the pair of retainer arms are extensions of the sleeve.

6. The USB connector of claim 1 wherein:
   the pair of retainer arms are of resilient material.

7. The USB connector of claim 1 wherein:
   the pair of retainer arms have a portion bent angularly.

8. An electrical connector comprising:
   a sleeve;
   electrical contacts in the sleeve;
   electrical connector pins extending from the sleeve; and
   retainer arms extending from the sleeve.

9. The electrical connector of claim 8 wherein:
   the sleeve carries the electrical contacts.

10. The electrical connector of claim 8 wherein:
    the electrical connector pins are in parallel with a longitudinal axis of the sleeve.

11. The electrical connector of claim 8 wherein:
    the retainer arms extend in a direction generally parallel to a longitudinal axis of the sleeve.

12. The electrical connector of claim 8 wherein:
    the retainer arms are comprised of a material; and
    the sleeve is comprised of the material.

13. The electrical connector of claim 8 wherein:
    the retainer arms are of resilient material.

14. The electrical connector of claim 8 wherein:
    the retainer arms are bent angularly.

15. The electrical connector of claim 8 wherein:
    the retainer arms extend from an end of the sleeve; and
    the electrical connector pins extend from the end of the sleeve.

16. The electrical connector of claim 8 further comprising:
    a shoulder adjacent to the sleeve.

17. The electrical connector of claim 8 wherein:
    the sleeve is elongated.

18. The electrical connector of claim 12 wherein:
    the retainer arms are extensions of the sleeve.

19. The electrical connector of claim 14 wherein:
    the retainer arms are bent away from a center of the sleeve and are bent toward the center of the sleeve.

20. The electrical connector of claim 16 wherein:
    the shoulder is located adjacent to the retainer arms.

21. The electrical connector of claim 16 wherein:
    the shoulder is located adjacent to the electrical connector pins.

22. The electrical connector of claim 16 wherein:
    the shoulder is located around a circumference of the sleeve.

23. The electrical connector of claim 16 wherein:
    the retainer arms extend from an end of the sleeve;
    the as the electrical connector pins extend from the end of the sleeve; and
    the shoulder is located around a circumference of the end of the sleeve.

24. The electrical connector of claim 19 wherein:
    the retainer arms are extensions of the sleeve.

25. The electrical connector of claim 23 wherein:
    the retainer arms are extensions of the sleeve.

* * * * *